US006982596B2

(12) United States Patent
Kumeta et al.

(10) Patent No.: US 6,982,596 B2
(45) Date of Patent: Jan. 3, 2006

(54) OPERATIONAL TRANSCONDUCTANCE AMPLIFIER AND AGC AMPLIFIER USING THE SAME

(75) Inventors: Tomoyuki Kumeta, Kawasaki (JP); Yoshihiro Kizaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 19 days.

(21) Appl. No.: 10/443,104

(22) Filed: May 22, 2003

(65) Prior Publication Data

US 2003/0222716 A1    Dec. 4, 2003

(30) Foreign Application Priority Data

May 28, 2002    (JP)    ............................. 2002-153810

(51) Int. Cl.
    *H03F 3/45*    (2006.01)
(52) U.S. Cl. ...................................... 330/253; 330/254
(58) Field of Classification Search ................ 330/253, 330/254, 279, 9; 327/307
    See application file for complete search history.

(56) References Cited

U.S. PATENT DOCUMENTS

| 5,384,501 A | * | 1/1995 | Koyama et al. ............. 330/253 |
| 6,316,997 B1 | * | 11/2001 | Tammone, Jr. .............. 330/254 |
| 6,570,447 B2 | * | 5/2003 | Cyrusian et al. ............ 330/254 |

FOREIGN PATENT DOCUMENTS

JP    2001-60869 A    3/2001

* cited by examiner

*Primary Examiner*—Khanh V. Nguyen
(74) *Attorney, Agent, or Firm*—Arent Fox PLLC

(57) ABSTRACT

In an operational transconductance amplifier (OTA), resistors are bridge-connected to source terminals of MOSFETs that form a differential pair of the OTA. Capacitors are connected in parallel between the resistors in order to remove a DC signal component. The C-R circuit forms a high pass filter in order to intercept the DC component. Accordingly, even if there is a difference in transistor characteristic between the MOSFETs, a DC offset voltage does not appear in differential output terminals of the OTA and an output error can be eliminated. When the OTA is used in an AGC amplifier, an output dynamic range of the AGC amplifier can be made wide owing to the removal of the DC offset voltage.

9 Claims, 10 Drawing Sheets

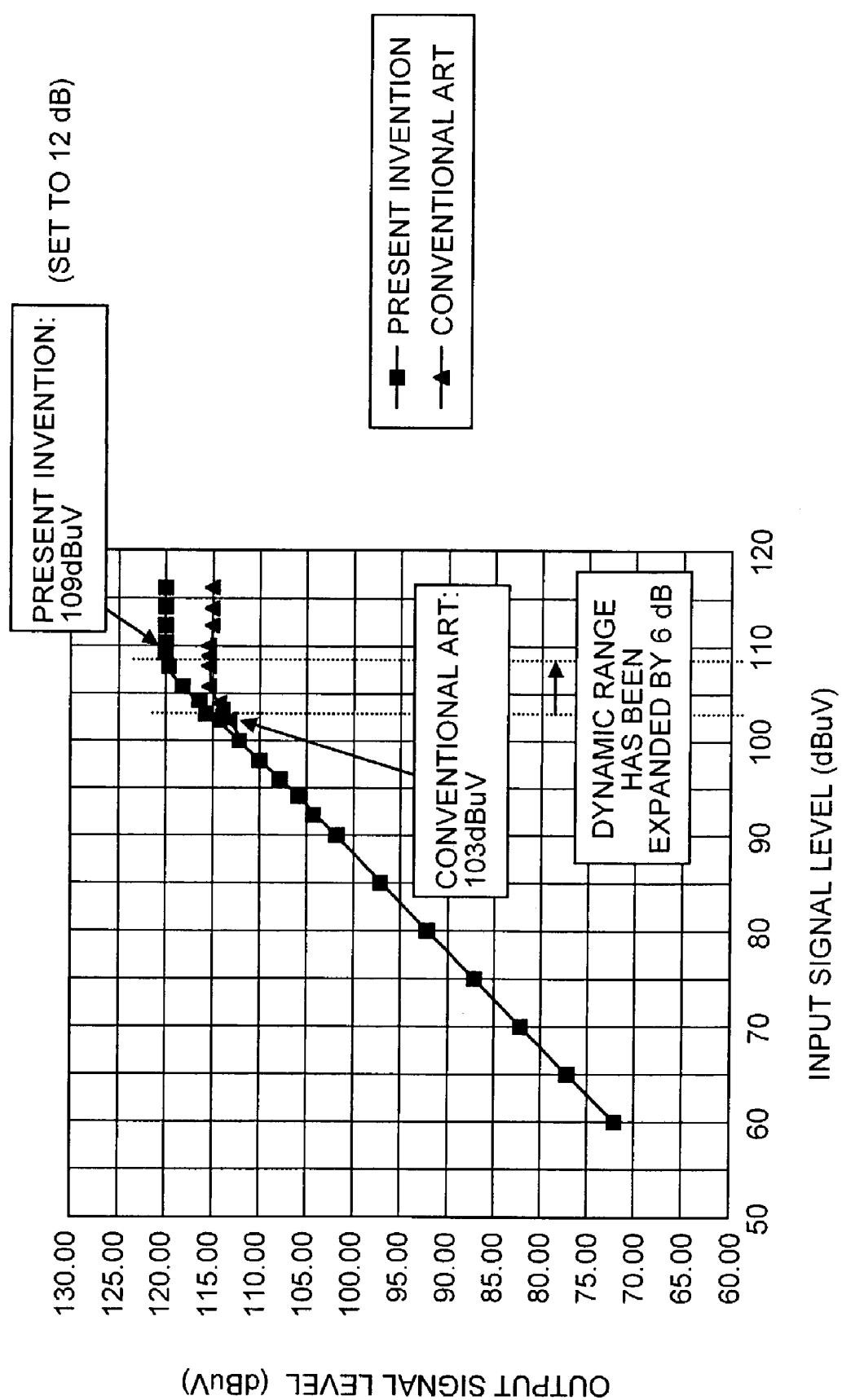

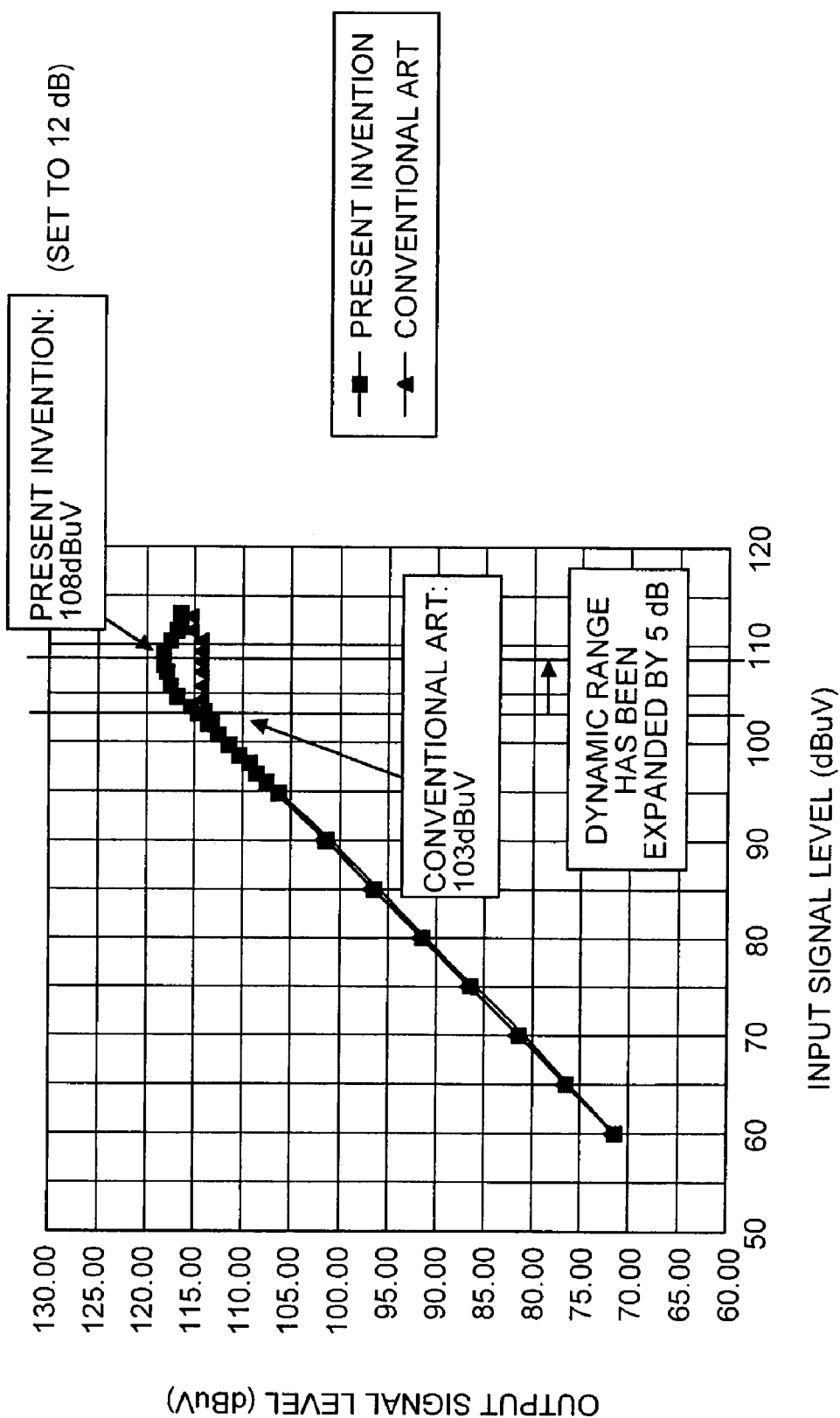

OPERATIONAL TRANSCONDUCTANCE AMPLIFIER AND AGC AMPLIFIER USING THE SAME

CROSS-REFERENCE TO RELATED APPLICATIONS

This application is based upon and claims the benefit of priority from the prior Japanese Patent Application No. 2002-153810, filed on May 28, 2002, the entire contents of which are incorporated herein by reference.

BACKGROUND OF THE INVENTION

1) Field of the Invention

The present invention relates to an operational transconductance amplifier (OTA) that is an amplifier having a controllable Gm (transconductance) and capable of removing a DC offset voltage inside the amplifier, and an automatic gain control (AGC) amplifier capable of obtaining an expanded output dynamic range by using the OTA.

2) Description of the Related Art

By using an OTA that is an amplifier having a controllable Gm (transconductance), an AGC amplifier and a filter each having a fixed gain can be obtained. FIG. 1 shows a circuit diagram of an internal configuration of a conventional OTA. Constant current sources I1 and I2 are connected to drain terminals of metal-oxide semiconductor field-effect transistors (MOSFETs) M1 and M2 respectively, and constant current sources I3 and I4 are connected to source terminals of the MOSFETs M1 and M2 respectively. Gain adjustment resistors (variable resistors) R3 and R4 are bridge-connected between source terminals of the MOSFETs M1 and M2. Gate terminals of the MOSFETs M1 and M2 are connected to differential input terminals IP and IM, respectively. The drain terminals of the MOSFETs M1 and M2 are connected to differential output terminals OP and OM, respectively.

FIG. 2 shows a circuit diagram of an AGC amplifier including the conventional OTA. An AGC gain is set based on setting in resistors (variable resistors) R3 and R4 inside an OTA 50 and external resistors (variable resistors) R5 and R6. If there is a difference in characteristic between a pair of transistors (referred to as differential pair) that forms differential input stages of the OTA 50, then a DC offset voltage is produced, causing an output error.

Conventionally, a high pass filter (HPF) including capacitors C1 and C2 and resistors R1 and R2 is disposed in an output stage of the AGC amplifier in order to remove the DC offset voltage. In such a configuration, source follower circuits are disposed as a buffer that drives the capacitors C1 and C2 included in an output section.

FIG. 3 shows a circuit diagram of a source follower circuit. In FIG. 1, a source follower circuit including M1 or M2 satisfies the following relations:

$$Vout/Vin=1 \quad (1)$$

$$Vout=Vin-Vth=Vin-0.6 \quad (2)$$

$$Vout>VDS2 \quad (3)$$

Therefore, the following relation is obtained $$Vin>VDS2+0.6 \quad (4)$$

where Vth is a threshold voltage.

When the source follower circuit is used, a voltage shift equivalent to a gate-source voltage (VGS) in an N channel-MOSFET is caused in the output of the AGC amplifier. The range of the input voltage is expressed as, for example, Vin>VDS2+0.6 (V) according to the expression (4). If the AGC amplifier 50 is provided with a circuit configuration having a low power supplied voltage, then the amplitude (dynamic range) of the output voltage cannot be made wide under the influence of the voltage shift, resulting in a problem.

SUMMARY OF THE INVENTION

The present invention has been achieved in order to solve the problem. It is an object of this invention to provide an operational transconductance amplifier capable of removing a DC offset voltage and eliminating an output error. It is another object to provide an AGC amplifier using the operational transconductance amplifier so that a wide output dynamic range can be obtained.

According to one aspect of the present invention, a high pass filter is provided within the operational transconductance amplifier to remove the DC offset voltage of a differential pair. The high pass filter can be formed simply by connecting capacitors between resistors bridge-connected to a pair of transistors that forms the differential pair.

According to the above aspect, the DC offset voltage of the operational transconductance amplifier is removed inside the amplifier, and consequently the DC offset voltage is not produced on differential output terminals. Thus, it is possible to provide the high quality operational transconductance amplifier with the output error removed. The AGC amplifier using the operational transconductance amplifier can obtain a wide dynamic range because a signal already subjected to removal of the DC offset voltage in the operational transconductance amplifier of the preceding stage is input. Owing to the expanded dynamic range, it is possible to provide the AGC amplifier improved in the intermodulation distortion characteristic.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 10 shows a simulation result for an input-output characteristic of an AGC amplifier using the OTA according to the present invention, FIG. 11 shows an actually measured result for an input-output characteristic of an AGC amplifier using the OTA according to the present invention.

DETAILED DESCRIPTION

Embodiments of the operational transconductance amplifier according to this invention and an AGC amplifier using the operational transconductance amplifier are explained in detail with reference to the accompanying drawings. The same components as those in the conventional configuration are denoted by like characters.

Figure 4:
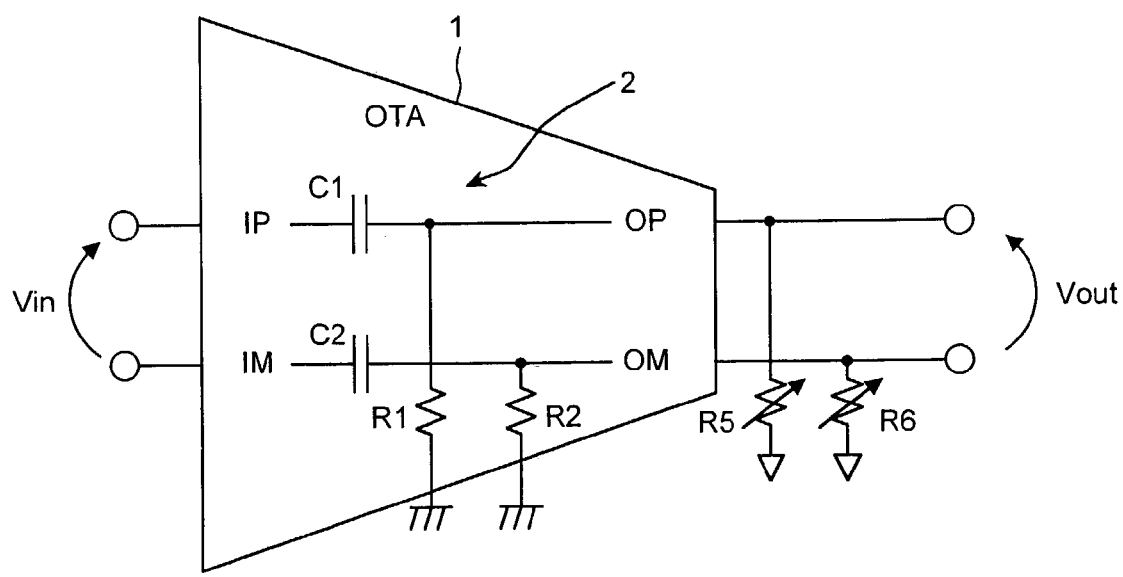
FIG. 4 shows a circuit diagram of a schematic configuration of an AGC amplifier using the OTA according to the present invention.

FIG. 4 shows a circuit diagram of a schematic configuration of an AGC amplifier using the OTA according to the present invention. In this invention, the source follower circuit, disposed outside the OTA in the conventional configuration in order to remove the DC offset voltage, is removed, and a high pass filter (HPF) 2 including the capacitors C1 and C2 and the resistors R1 and R2 is disposed within an OTA 1.

Figure 2:
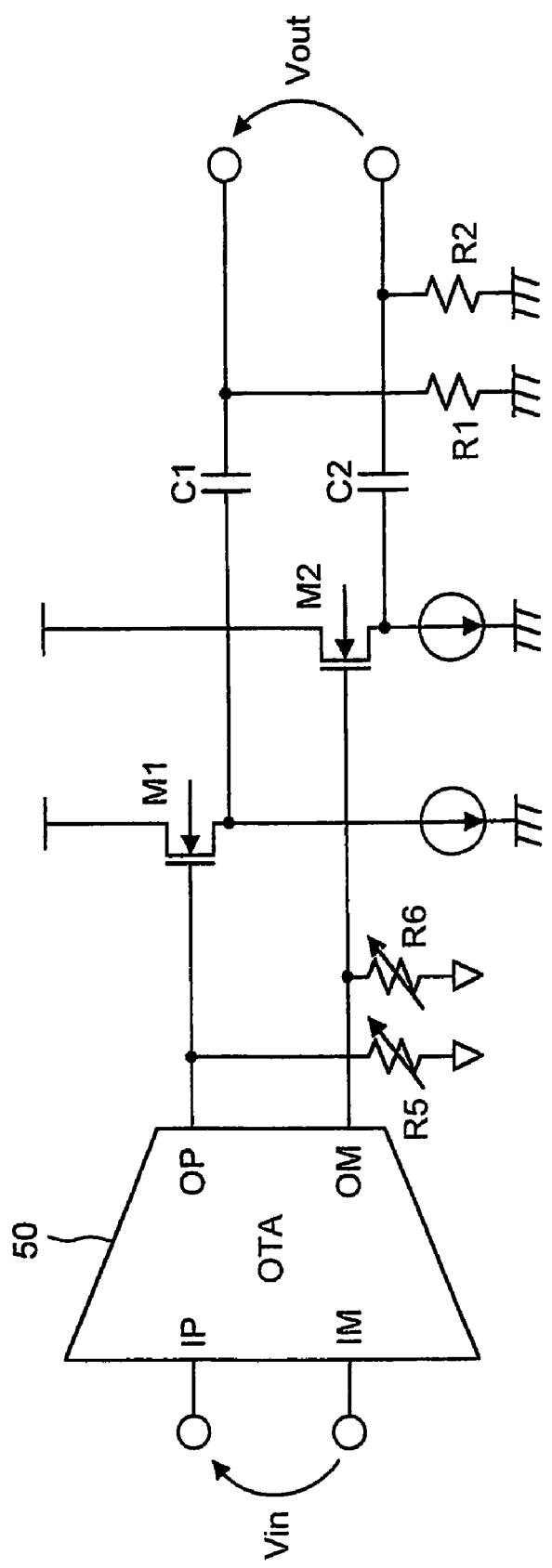
FIG. 2 shows a circuit diagram of an AGC amplifier including the conventional OTA.
Figure 3:
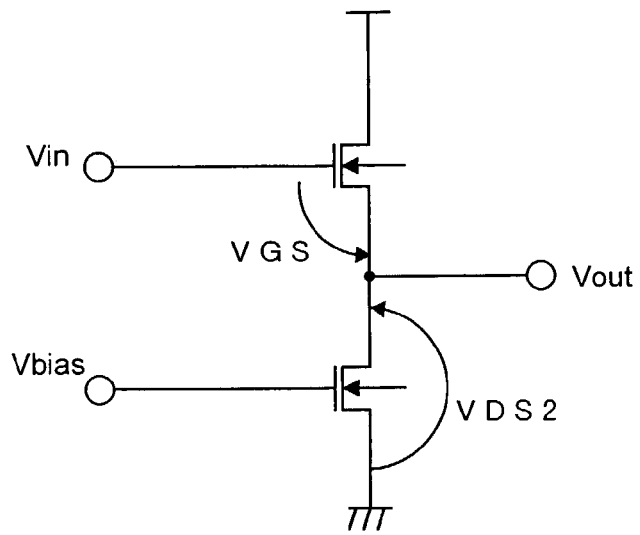
FIG. 3 shows a circuit diagram of a source follower circuit.

In an output section in the OTA 1, the capacitors C1 and C2 included in the high pass filter 2 are connected in series with output lines of differential output terminals OP and OM, respectively. First terminals of the resistors R1 and R2 are connected to the output lines, respectively. Second terminals of the resistors R1 and R2 are connected to ground (constant voltage). Resistors R5 and R6 can be varied in resistance for gain adjustment in the same way as FIG. 2. The circuit configuration shown in FIG. 4 is a conceptual diagram used to contrast the disposition state of the high pass filter 2 with the conventional configuration. Hereafter, the embodiments of the present invention are explained in detail.

Figure 5:
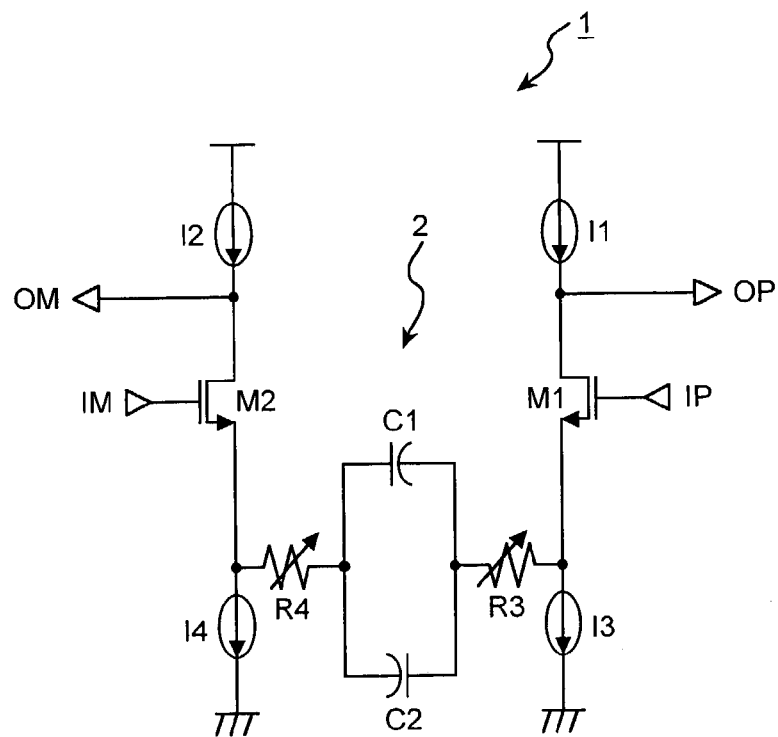
FIG. 5 shows a circuit diagram of an internal configuration of an OTA according to a first embodiment of the present invention.

FIG. 5 shows a circuit diagram of an internal configuration of an OTA according to a first embodiment of the present invention. In the first embodiment, the capacitors C1 and C2 connected in parallel are connected between resistors R3 and R4 bridge-connected respectively to source terminals of the MOSFETs M1 and M2 that form a differential pair of the OTA 1, in order to remove a DC signal component. These C-R circuits form the high pass filter 2 shown in FIG. 4. By interception of the DC component, a DC offset voltage does not appear in outputs of the differential output terminals OP and OM.

Therefore, in the AGC amplifier (see FIG. 4) using the OTA 1 shown in FIG. 5, a wide amplitude (dynamic range) can be obtained in its output voltage by the removal of the DC offset voltage. Since each of reference characters I1 to I4 denotes a constant current source similar to that of the conventional constant current source and a grounding section has a constant voltage, a voltage across the capacitors C1 and C2 becomes constant.

Gain setting to be used when using the OTA 1 shown in FIG. 5 as the AGC amplifier shown in FIG. 4 is explained below. The gain is set based on the following equation (6), where R3=R4, gm1=gm2>>1, C1=C2, R5=R6, and gm1 and gm2 denote transconductances of corresponding MOSFETs M1 and M2, respectively.

$$Iout/Vin = 1/2 \times gm1/(gm1(R3+1/C1)+1) \quad (5)$$

$$= 1/2 \times 1/(R3+1/C1)$$

Vout/Vin=½×R5/(R3+1/C1)(6)

By making the resistors R3 and R5 variable as shown in FIGS. 4 and 5, setting of the amplification factor (gain) can be altered according to the equation (6). Alternatively, the resistor R3 may be a fixed resistor, and the resistor R5a may be a variable resistor. On the contrary, the resistors R3 and R5 may be a variable resistor and a fixed resistor, respectively.

Figure 6:
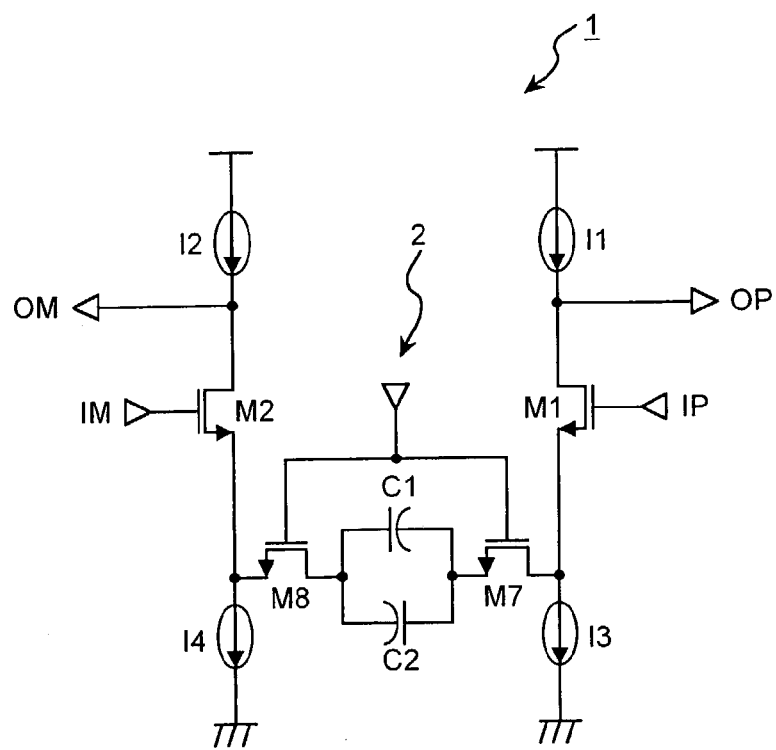
FIG. 6 shows a circuit diagram of another example of the internal configuration of the OTA according to the first embodiment.

FIG. 6 shows a circuit diagram of another example of the internal configuration of the OTA according to the first embodiment. In the configuration shown in FIG. 6, MOSFETs M7 and M8 are used respectively instead of the resistors R3 and R4 explained with reference to the first embodiment (FIG. 5). Source terminals and drain terminals of the MOSFETs M7 and M8 are connected in series with capacitors C1 and C2. Gate terminals of the MOSFETs M7 and M8 are connected to each other and supplied with a predetermined bias voltage to form linear resistance. Even when such a configuration has been formed, it is possible to intercept a DC signal component by using capacitance of C1 (the capacitors C1 and C2) indicated in the equation (6) and remove a DC offset voltage.

According to such an AGC amplifier, the output dynamic range can be expanded and consequently an intermodulation distortion characteristic of the AGC amplifier can be improved by the expanded dynamic range. Since it is not necessary to provide the capacitors and the source follower circuits outside the OTA unlike the conventional configuration, current consumption of the source follower circuits can be reduced.

Figure 7:
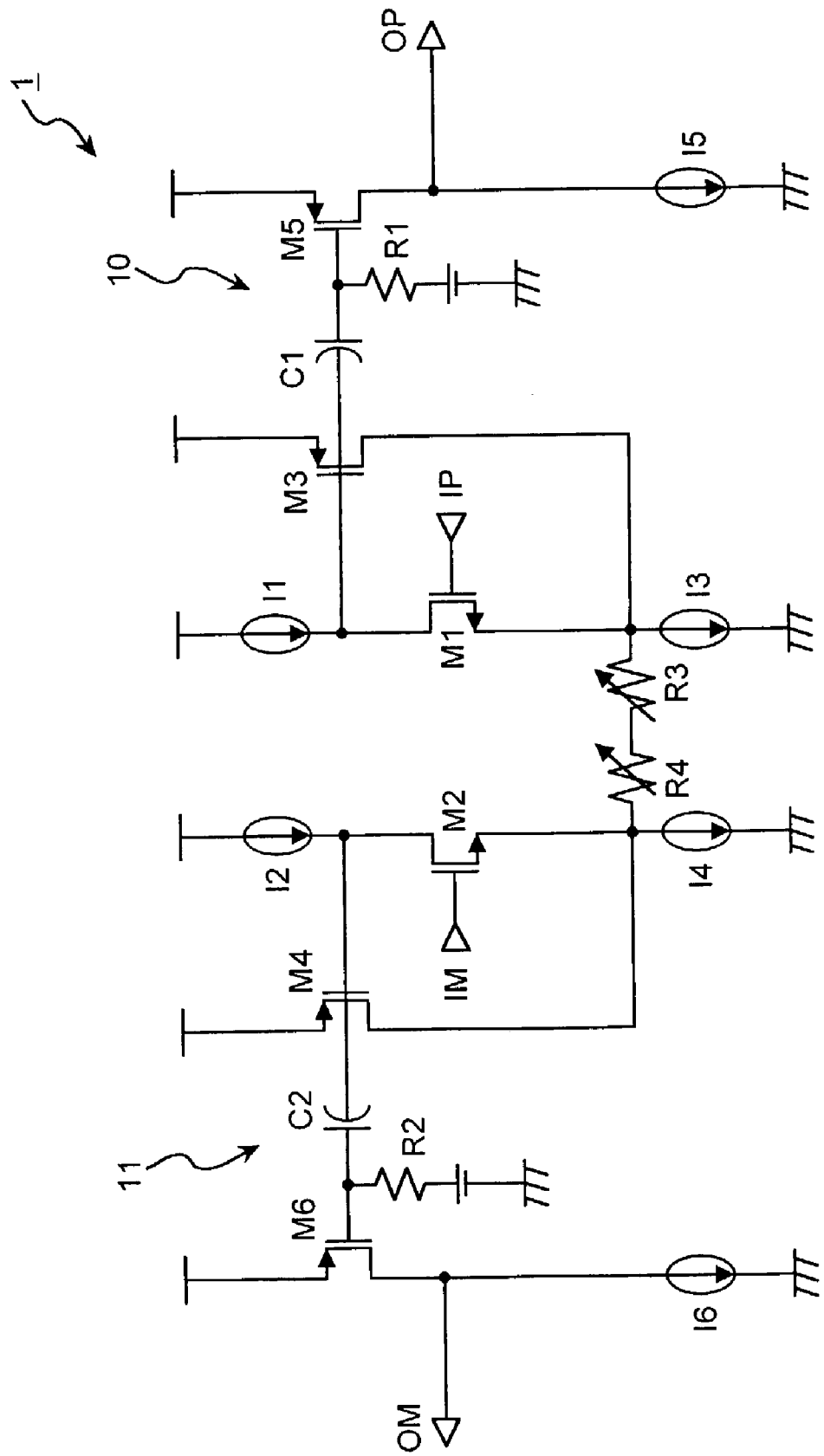
FIG. 7 shows a circuit diagram of an internal configuration of an OTA according to a second embodiment of the present invention.

FIG. 7 shows a circuit diagram of an internal configuration of an OTA according to a second embodiment of the present invention. In the second embodiment, gate terminals of the MOSFETs M3 and M4 are connected to drain terminals of the MOSFETs M1 and M2, respectively. The MOSFETs M3 and M4 are provided to generate constant voltages by making source-gate voltages of the MOSFETs M1 and M2 constant and thereby making transconductances of the MOSFETs M1 and M2 constant.

The MOSFETs M5 and M6 are provided to conduct output biasing on the OTA 1. Gate terminals of the MOSFETs M5 and M6 are connected to the gate terminals of the MOSFETs M3 and M4 via high pass filters 10 and 11, respectively. Source terminals of the MOSFETs M5 and M6 are connected to constant current sources I5 and I6, and in addition, connected to differential output terminals OP and OM, respectively.

The high pass filter 10 includes a C-R circuit, which in turn includes the capacitor C1 connected in series between the gate terminal of the MOSFET M3 and the gate terminal of the MOSFET M5 and the resistor R1 connected at its first end to an output line and connected at its second end to ground. In the same way, the high pass filter 11 includes the capacitor C2 provided between the gate terminal of the MOSFET M4 and the gate terminal of the MOSFET M6, and the resistor R2.

Since the DC component is intercepted by the high pass filters 10 and 11, the DC offset voltage does not appear in the outputs of the AGC amplifier and the amplitude (dynamic range) of the output voltage can be made wide.

Gain setting to be used when using the OTA 1 shown in FIG. 7 as the AGC amplifier shown in FIG. 4 is explained. The gain is set based on the following equations, where R3=R4, gm1=gm2>>1, gm3=gm4=gm5=gm6, C1=C2, and R5=R6.

$$Iout/Vin = 1/2 \times 1/R3 \times gm5/gm3 \quad (7)$$
$$= 1/2 \times 1/R3$$

Vout/Vin=½×R5/R3 (8)

In the same way as the explanation of the first embodiment, setting of the amplification factor (gain) can be altered according to the equation (8) by making the resistors R3 and R5 a combination of a fixed resistor and a variable resistor. In the same way as the explanation of FIG. 6, linear resistors using two MOSFETs may be provided instead of the resistors R3 and R4 bridge-connected between sources of the MOSFETs M1 and M2. In any configuration, the DC signal component can be intercepted by the high pass filters 10 and 11 that respectively include C-R circuits.

Figure 8:
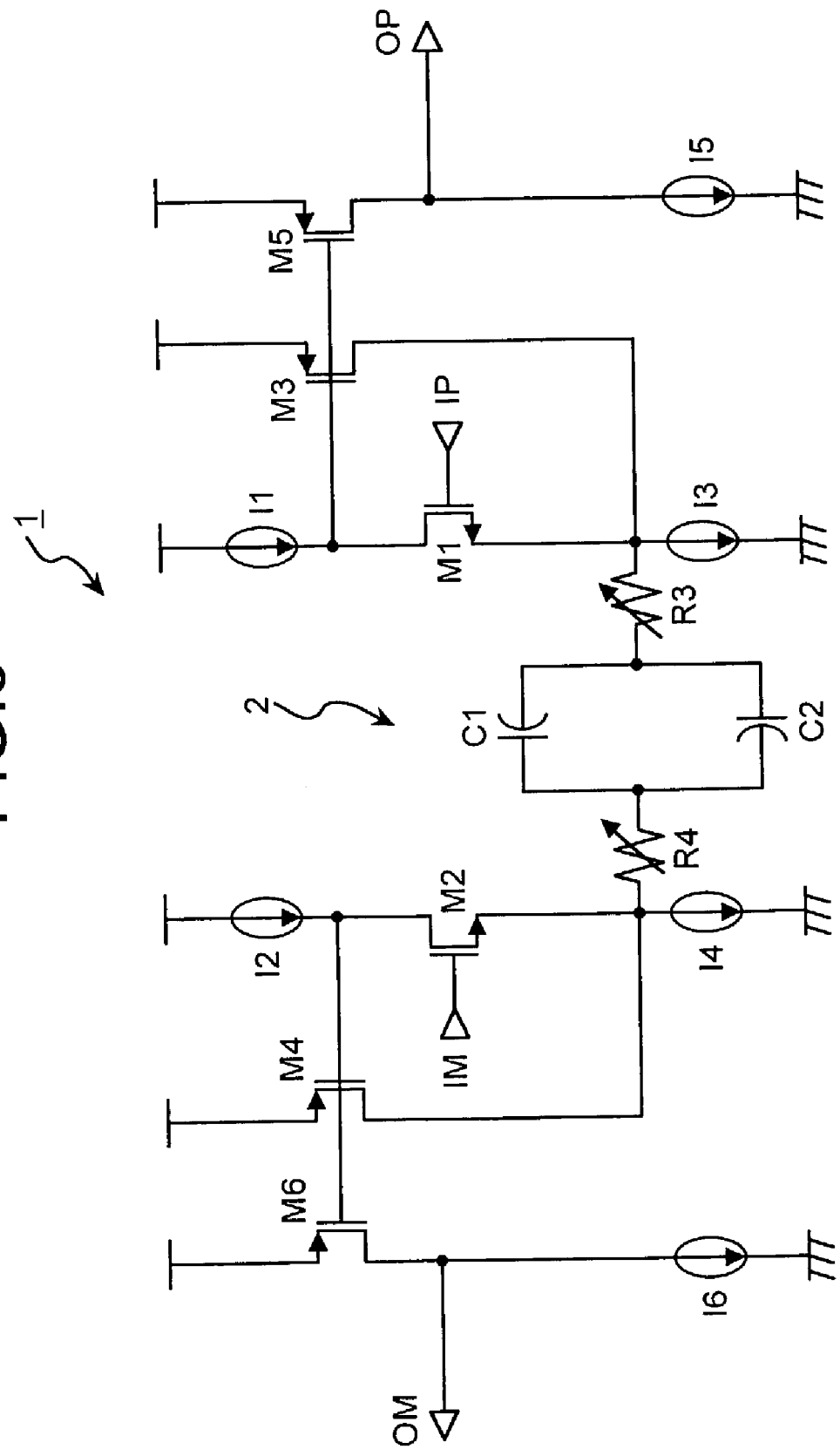
FIG. 8 shows a circuit diagram of an internal configuration of an OTA according to a third embodiment of the present invention.

FIG. 8 shows a circuit diagram of an internal configuration of an OTA according to a third embodiment of the present invention. In a circuit configuration of the third embodiment, the high pass filter 2 explained with reference to the first embodiment is disposed instead of the high pass filters 10 and 11 described with reference to the second embodiment. The third embodiment has the same configuration as that of the second embodiment except for this filter.

The high pass filter 2 includes the resistors R3 and R4 bridge-connected to source terminals of MOSFETs M1 and M2, that form a differential pair of an OTA 1, and the capacitors C1 and C2 connected in parallel between the resistors R3 and R4. The DC component is intercepted by the capacitors C1 and C2. When the OTA 1 is used in the AGC amplifier (see FIG. 4), therefore, the DC offset voltage does not appear in the outputs of the AGC amplifier and it becomes possible to make the amplitude (dynamic range) of the output wide.

Gain setting to be used when using the OTA 1 shown in FIG. 8 as the AGC amplifier shown in FIG. 4 is explained. The gain is set based on the following equations, where R3=R4, gm1=gm2>>1, gm3=gm4=gm5=gm6, C1=C2, and R5=R6.

$$Iout/Vin = \tfrac{1}{2} \times 1/(R3+1/C1) \quad (9)$$

$$Vout/Vin = \tfrac{1}{2} \times R5/(R3+1/C1) \quad (10)$$

In the same way as the explanation of the first embodiment, setting of the amplification factor (gain) can be altered according to the equation (10) by making the resistors R3 and R5 a combination of a fixed resistor and a variable resistor.

Figure 9:
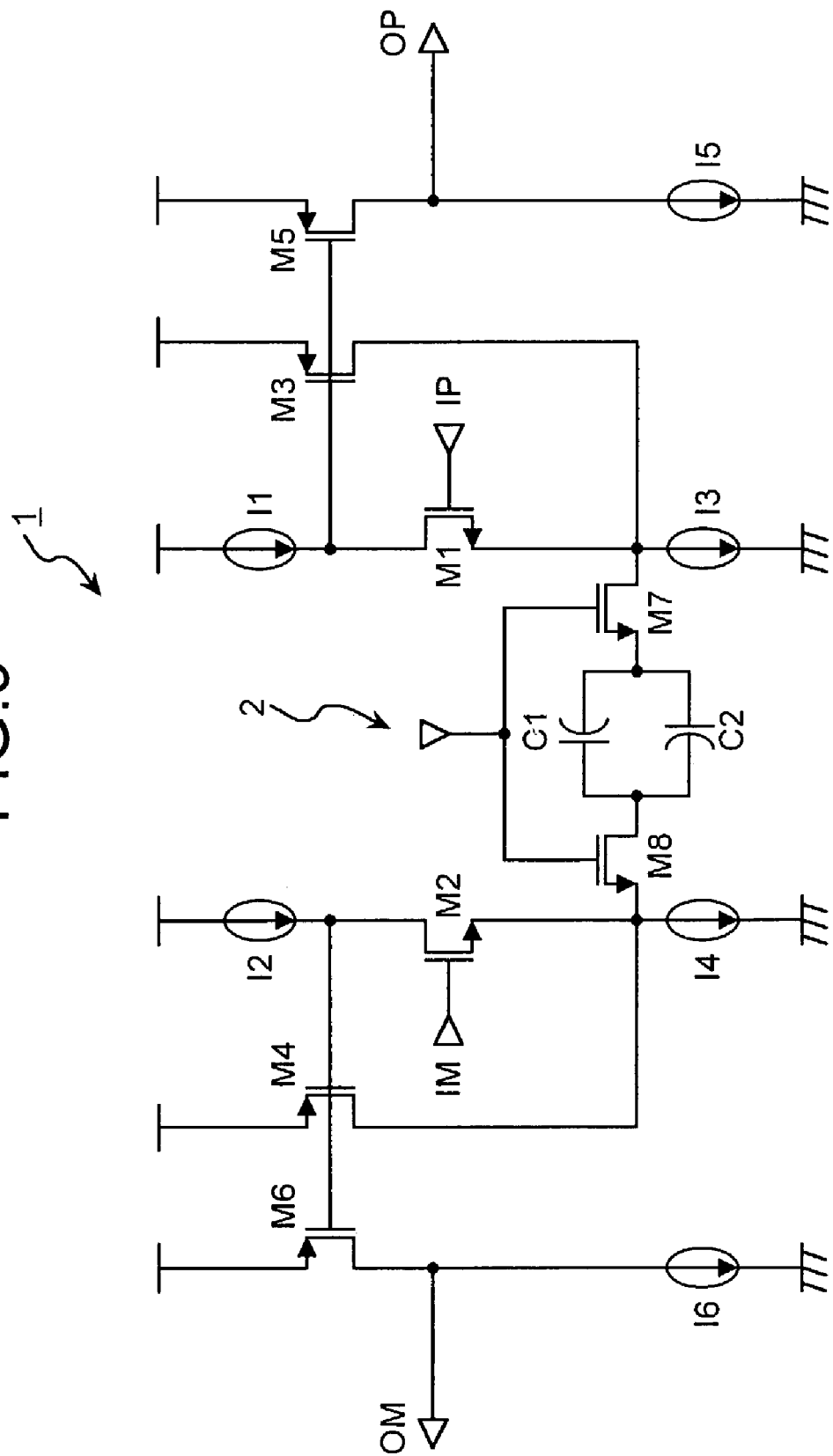
FIG. 9 shows a circuit diagram of another example of the internal configuration of the OTA according to the third embodiment.

FIG. 9 shows a circuit diagram of another example of the internal configuration of the OTA according to the third embodiment. In the configuration shown in FIG. 9, MOSFETs M7 and M8 are used respectively instead of the resistors R3 and R4 explained with reference to the third embodiment (FIG. 8). Source terminals and drain terminals of the MOSFETs M7 and M8 are connected in series with capacitors C1 and C2. Gate terminals of the MOSFETs M7 and M8 are connected to each other and supplied with a predetermined bias voltage to form linear resistance. Even when such a configuration has been formed, it is possible to intercept a DC signal component by using capacitance of C1 (the capacitors C1 and C2) indicated in the equation (10) and remove a DC offset voltage.

Figure 1:
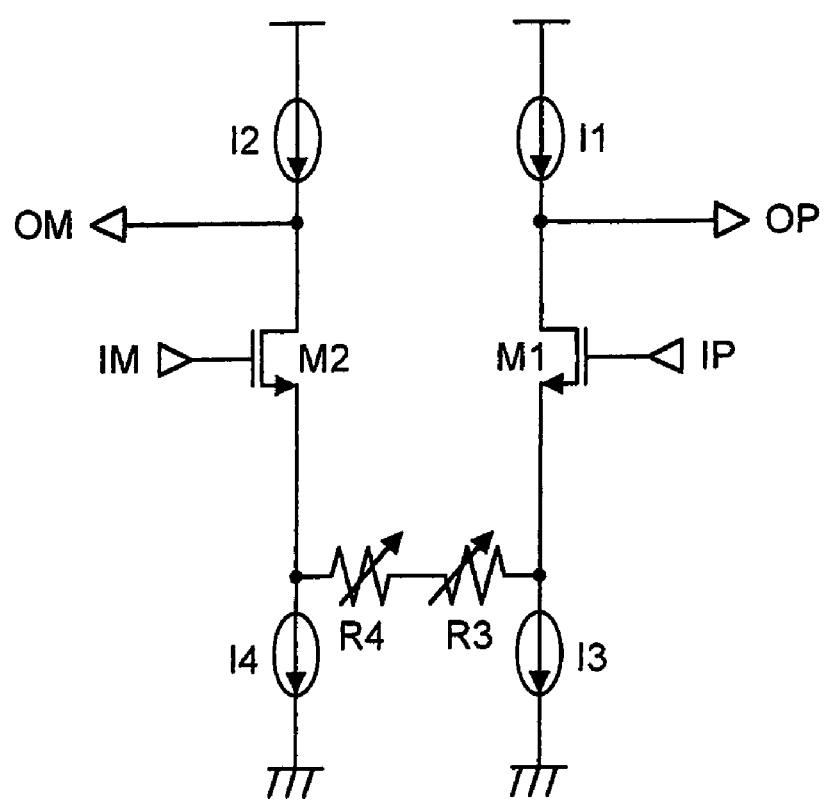
FIG. 1 shows a circuit diagram of an internal configuration of a conventional OTA.

FIG. 10 shows a simulation result for an input-output characteristic of an AGC amplifier using the OTA according to the present invention. The simulation result is obtained by effecting a transient analysis when the circuit configuration explained with reference to the second embodiment (see FIG. 7) is used as the OTA 1 assuming the gain setting=12 dB and the power supply voltage=2.8 V. A characteristic of a circuit configuration having the conventional configuration (see FIG. 1) is also shown.

As appreciated from FIG. 10, linearity of an output signal level can be obtained until an input signal level reaches 109 dBuV in the AGC amplifier (see FIG. 4) using the OTA 1 according to the present invention. On the other hand, linearity of the AGC amplifier (see FIG. 2) using the conventional OTA (FIG. 1) is obtained until the input signal level reaches 103 dBuV. According to the indicated result, the dynamic range can be expanded by 6 dB as compared with the conventional configuration, when the OTA 1 of the present invention is used.

FIG. 11 shows an actually measured result for an input-output characteristic of an AGC amplifier using the OTA according to the present invention. FIG. 11 shows a result obtained by effecting an actual measurement when an experimental chip having the circuit configuration explained with reference to the second embodiment (see FIG. 7) mounted thereon is used as the OTA 1, assuming the gain setting is 12 dB and the power supply voltage=2.8 V. A characteristic of an experimental chip on which the circuit configuration having the conventional configuration (see FIG. 1) is mounted is also shown in FIG. 11.

As appreciated from FIG. 11, linearity of an output signal level can be obtained until an input signal level reaches 108 dBuV in the AGC amplifier (see FIG. 4) using the OTA 1 according to the present invention. On the other hand, linearity of the AGC amplifier (see FIG. 2) using the conventional OTA (FIG. 1) is obtained until the input signal level reaches 103 dBuV. According to the indicated result, the dynamic range can be expanded by 5 dB as compared with the conventional configuration, when the OTA 1 of the present invention is used.

Figure 12B:
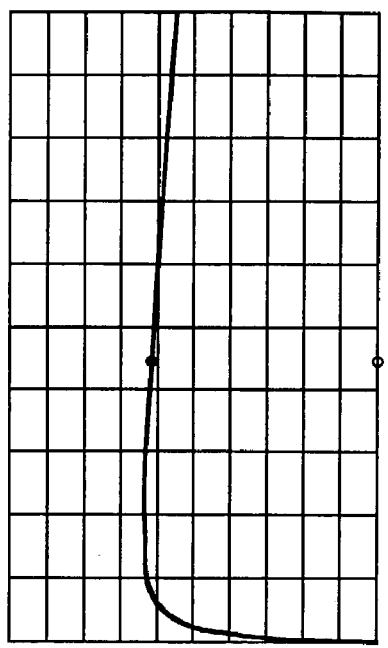
FIG. 12B shows actually measured results for frequency characteristics of an AGC amplifier using the conventional OTA.
Figure 12A:
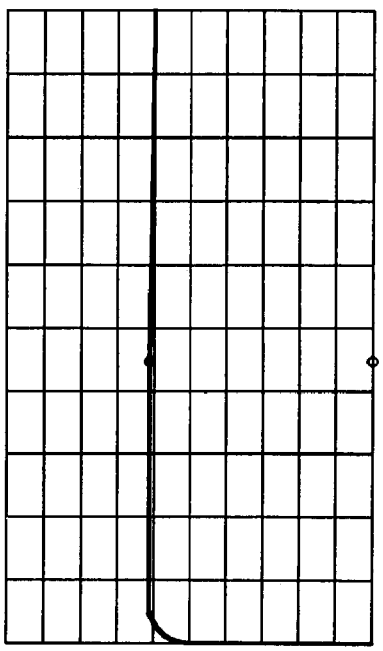
FIG. 12A shows actually measured results for frequency characteristics of an AGC amplifier using the OTA according to the present invention.

FIG. 12A shows an actually measured result for an output frequency characteristic of an AGC amplifier using the OTA according to the present invention. FIG. 12A shows a result obtained by effecting an actual measurement when an experimental chip having the circuit configuration explained with reference to the second embodiment (see FIG. 7) mounted thereon is used as the OTA 1, assuming the gain setting is 12 dB and the power supply voltage=2.8 V. FIG. 12B shows a characteristic of an experimental chip on which the circuit configuration having the conventional configuration (see FIG. 1) is mounted. The abscissa represents a frequency and the ordinate represents a gain.

As shown in FIG. 12A, according to the AGC amplifier (see FIG. 4) using the OTA 1 of the present invention, it is possible to obtain such a characteristic that a set gain of 12 dB can be output flat over the entire frequency range. On the other hand, as shown in FIG. 12B, in the AGC amplifier (see FIG. 2) using the conventional OTA (FIG. 1), the gain in a low frequency band is greater than the set value (12 dB) and the gain in a high frequency band becomes less than the set value. By using the OTA 1 according to the present invention, a frequency characteristic that is flatter than that of the conventional configuration is obtained. The DC offset component (10 Hz) is removed in both the conventional configuration and the configuration according to the present invention.

The present invention is not limited to the configuration of the OTA, but various modifications can be effected. For example, the differential pair is not limited to MOSFETs, but bipolar transistors may also be used. The present invention can effectively eliminate the influence of the DC offset voltage particularly when the AGC amplifier is formed for a low power supply voltage. The subject of application of the OTA is not limited to the AGC amplifier. For example, the OTA can be applied to a filter as well. In this case, it becomes possible to improve the filter characteristic based on removal of the DC offset voltage within the OTA.

According to the present invention, the DC offset voltage of the differential pair is removed within the operational transconductance amplifier. This brings about an advantageous effect that it is possible to provide a high quality operational transconductance amplifier in which the DC offset voltage is not produced on differential output terminals and the output error is eliminated. An AGC amplifier using the operational transconductance amplifier according to the present invention brings about an advantageous effect that the output dynamic range can be made wide because the AGC amplifier is not affected by the DC offset voltage. The expanded dynamic range brings about an advantageous effect that the intermodulation distortion characteristic of the AGC amplifier can be improved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein-set forth.

What is claimed is:

1. An operational transconductance amplifier comprising:
   a pair of metal-oxide semiconductor field-effect transistors (MOSFETs) that serves as a differential pair for conducting differential amplification on input voltages;
   a plurality of constant current sources;
   a pair of resistors bridge-connected to source terminals of the pair of MOSFETs;
   a pair of constant voltage MOSFETs that keeps a voltage between source and gate terminals of the MOSFETs as the differential pair constant and keeps transconductance constant;
   a pair of biasing MOSFETs provided in differential output stages and connected to differential output terminals of the operational transconductance amplifier for conducting biasing on outputs of the differential outputs of the differential pair; and
   a plurality of capacitors connected between the pair of resistors and for removing a DC offset voltage caused by a characteristic difference between the MOSFETs as the differential pair.

2. The operational transconductance amplifier according to claim 1, wherein a pair of MOSFETs is used instead of the pair of resistors, and connected in series to the capacitors to be used as linear resistors.

3. An operational transconductance amplifier comprising:
   a pair of metal-oxide semiconductor field-effect transistors (MOSFET) that serves as a differential pair for conducting differential amplification on input voltages;
   a plurality of constant current sources;
   a pair of resistors bridge-connected to source terminals of the pair of MOSFETs;
   a pair of constant voltage MOSFETs that keeps a voltage between source and gate terminals of the MOSFETs as the differential pair constant and keeps transconductance constant;
   a pair of biasing MOSFETs provided in differential output stages and for using as bias outputs of the differential pair; and
   a plurality of high pass filters each provided with a capacitor and a resistor, provided between gate terminal of the constant voltage MOSFET and gate terminal of the biasing MOSFET, respectively, and for removing a DC offset voltage caused by a characteristic difference between the MOSFETs as the differential pair.

4. The operational transconductance amplifier according to claim 3, wherein a pair of MOSFETs is used instead of the pair of resistors, and connected in series to the capacitors to be used as linear resistors.

5. An automatic gain control (AGC) amplifier using an operational transconductance amplifier, the AGC amplifier comprising:
   the operational transconductance amplifier including
   a pair of transistors that serves as a differential pair for conducting differential amplification on input voltages,
   a plurality of constant current sources,
   a first pair of resistors bridge-connected to the pair of transistors, and
   a plurality of capacitors connected between the pair of resistors and for removing a DC offset voltage caused by a characteristic difference between the pair of transistors; and
   a second pair of resistors for gain setting and are connected to differential output terminals of the operational transconductance amplifier, respectively.

6. An automatic gain control (AGC) amplifier using an operational transconductance amplifier, the AGC amplifier comprising:
   the operational transconductance amplifier including
   a pair of metal-oxide semiconductor field-effect transistors (MOSFETs) that serves as a differential pair for conducting differential amplification on input voltages,
   a plurality of constant current sources,
   a first pair of resistors bridge-connected to source terminals of the pair of MOSFETs,
   a pair of constant voltage MOSFETs that keeps a voltage between source and gate terminals of the MOSFETs as the differential pair constant and keeps transconductance constant,
   a pair of biasing MOSFETs provided in differential output stages and connected to differential output terminals of the operational transconductance amplifier for conducting biasing on outputs of the differential outputs of the differential pair, and
   a plurality of capacitors connected between the pair of resistors and for removing a DC offset voltage caused by a characteristic difference between the MOSFETs as the differential pair; and
   a second pair of resistors for gain setting and are connected to the differential output terminals of the operational transconductance amplifier, respectively.

7. The AGC amplifier using an operational transconductance amplifier according to claim 6, wherein in the operational transconductance amplifier, a pair of MOSFETs is used instead of the pair of resistors, and connected in series to the capacitors to be used as linear resistors.

8. An automatic gain control (AGC) amplifier using an operational transconductance amplifier, the AGC amplifier comprising:

the operational transconductance amplifier including
a pair of metal-oxide semiconductor field-effect transistors (MOSFETs) that serves as a differential pair for conducting differential amplification on input voltages,
a plurality of constant current sources,
a first pair of resistors bridge-connected to source terminals of the pair of MOSFETs,
a pair of constant voltage MOSFETs that keeps a voltage between source and gate terminals of the MOSFETs as the differential pair constant and keeps transconductance constant,
a pair of biasing MOSFETs provided in differential output stages and connected to differential output terminals of the operational transconductance amplifier for conducting biasing on outputs of the differential pair, and
a plurality of high pass filters each provided with a capacitor and a resistor, provided between gate terminal of the constant voltage MOSFET and gate terminal of the biasing MOSFET, respectively, and for removing a DC offset voltage caused by a characteristic difference between the MOSFETs as the differential pair; and
a second pair of resistors for gain setting and are connected to differential output terminals of the operational transconductance amplifier, respectively.

9. The AGC amplifier according to claim 8, wherein in the operational transconductance amplifier, a pair of MOSFETs and parallel capacitors between the MOSFETs are used instead of the first pair of resistors, to be used as linear resistors.

* * * * *